(12) United States Patent
Oh et al.

(10) Patent No.: US 8,883,259 B2
(45) Date of Patent: Nov. 11, 2014

(54) THIN FILM DEPOSITION APPARATUS

(75) Inventors: Eon-Seok Oh, Yongin (KR);
Yong-Joong Choi, Yongin (KR);
Myung-Ki Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 230 days.

(21) Appl. No.: 13/294,102

(22) Filed: Nov. 10, 2011

(65) Prior Publication Data
US 2012/0132137 A1 May 31, 2012

(30) Foreign Application Priority Data

Nov. 26, 2010 (KR) .................. 10-2010-0118961

(51) Int. Cl.
| | |
|---|---|
| *B05B 15/04* | (2006.01) |
| *C23C 16/00* | (2006.01) |
| *H01L 21/677* | (2006.01) |
| *C23C 14/04* | (2006.01) |
| *C23C 14/56* | (2006.01) |
| *H01L 21/67* | (2006.01) |
| *C23C 14/24* | (2006.01) |
| *H01L 51/56* | (2006.01) |

(52) U.S. Cl.
CPC .......... *C23C 14/042* (2013.01); *H01L 21/6776* (2013.01); *H01L 51/56* (2013.01); *C23C 14/568* (2013.01); *H01L 21/67173* (2013.01); *C23C 14/24* (2013.01); *C23C 14/243* (2013.01)
USPC ........................................ 427/248.1; 118/715

(58) Field of Classification Search
None
See application file for complete search history.

(56) References Cited

U.S. PATENT DOCUMENTS

| | | | |
|---|---|---|---|
| 2002/0076847 A1 | 6/2002 | Yamada et al. | |
| 2005/0016461 A1* | 1/2005 | Klug et al. | 118/726 |
| 2005/0118788 A1 | 6/2005 | Kuwahara et al. | |
| 2008/0018236 A1* | 1/2008 | Arai et al. | 313/504 |
| 2009/0229524 A1* | 9/2009 | Kim et al. | 118/726 |

FOREIGN PATENT DOCUMENTS

| | | |
|---|---|---|
| JP | 2005-163099 A | 6/2005 |
| JP | 2008-156686 A | 7/2008 |
| JP | 2008-274373 A | 11/2008 |
| KR | 10-2002-0025760 A | 4/2002 |

* cited by examiner

*Primary Examiner* — Joseph Miller, Jr.
(74) *Attorney, Agent, or Firm* — Knobbe, Martens, Olson & Bear, LLP

(57) ABSTRACT

A thin film deposition apparatus is disclosed. In one embodiment, the apparatus includes i) a deposition source configured to discharge a deposition material, ii) a deposition source nozzle unit disposed at a side of the deposition source and comprising a plurality of deposition source nozzles arranged in a first direction and iii) a patterning slit sheet disposed opposite to the deposition source nozzle unit and comprising a plurality of patterning slits arranged in a second direction substantially perpendicular to the first direction. The patterning slit sheet may include: i) a base sheet, in which a plurality of sub-patterning slits are formed in the second direction and ii) a plurality of patterning bars disposed between adjacent sub-patterning slits to form the patterning slits. Further, the deposition apparatus is configured to perform deposition while the substrate is moved relative to the thin film deposition apparatus in the first direction.

10 Claims, 12 Drawing Sheets

THIN FILM DEPOSITION APPARATUS

CROSS-REFERENCE TO RELATED PATENT APPLICATION

This application claims the benefit of Korean Patent Application No. 10-2010-0118961, filed on Nov. 26, 2010, in the Korean Intellectual Property Office, the disclosure of which is incorporated herein in its entirety by reference.

BACKGROUND

1. Field

The described technology generally relates to a thin film deposition apparatus, and more particularly, to a thin film deposition apparatus that can be simply applied to produce large-sized display devices on a mass scale and that can be used for high-definition patterning.

2. Description of the Related Technology

Organic light-emitting displays have a larger viewing angle, better contrast characteristics, and a faster response rate than other display devices, and thus have drawn attention as next-generation displays.

An organic light-emitting display device includes intermediate layers, including an emission layer disposed between a first electrode and a second electrode that are arranged opposite to each other. The electrodes and the intermediate layers may be formed by using various methods, one of which is to perform a separate deposition method for each layer. When an organic light-emitting display device is manufactured by using the separate deposition method, a fine metal mask (FMM) having the same pattern as an organic layer to be formed is disposed to closely contact a substrate, and an organic layer material is deposited over the FMM in order to form the organic layer.

However, the deposition method using such a FMM is not suitable for manufacturing larger devices using a mother glass having a size of 5 G (1100×1300 mm) or greater. In other words, when such a large mask is used, the mask may bend due to self-gravity, thereby distorting a pattern. This is not conducive for the recent trend towards high-definition patterns.

SUMMARY

One inventive aspect is a thin film deposition apparatus that may be simply applied to produce large-sized display devices on a mass scale and may prevent a patterning slit sheet from sagging.

Another aspect is a thin film deposition apparatus for forming a thin film on a substrate, the apparatus including a deposition source for discharging a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in a second direction perpendicular to the first direction. The patterning slit sheet includes a base sheet, in which a plurality of sub patterning slits are formed in a second direction perpendicular to the first direction; and a plurality of patterning bars disposed between adjacent sub patterning slits to form the plurality of patterning slits. Deposition is performed while the substrate is moved relative to the thin film deposition apparatus in the first direction.

The deposition source, the deposition source nozzle unit, and the patterning slit sheet may be formed as one body.

The deposition source, the deposition source nozzle unit, and the patterning slit sheet may be integrally connected as one body by connection members that guide movement of the deposition material.

The connection members may be formed to seal a space between the deposition source, the deposition source nozzle unit, and the patterning slit sheet.

The plurality of deposition source nozzles may be tilted at a predetermined angle.

The plurality of deposition source nozzles may include deposition source nozzles arranged in two rows and in the first direction. The deposition source nozzles in the two rows may be tilted to face each other.

The plurality of deposition source nozzles may include deposition source nozzles arranged in two rows and in the first direction. The deposition source nozzles of one of the two rows, which is located at a first side of the patterning slit sheet, may be arranged to face a second side of the patterning slit sheet, and the deposition source nozzles of the other row located at the second side of the patterning slit sheet may be arranged to face the first side of the patterning slit sheet.

The base sheet may be formed of glass.

The plurality of patterning slits may be opening regions between adjacent patterning bars.

A width of each of the plurality of patterning slits may be less than a width of each of the plurality of sub patterning slits.

Another aspect is a thin film deposition apparatus for forming a thin film on a substrate, the apparatus including a deposition source for discharging a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits arranged in the first direction; and a barrier plate assembly including a plurality of barrier plates that are disposed between the deposition source nozzle unit and the patterning slit sheet in the first direction, the barrier plate assembly for partitioning a space between the deposition source nozzle unit and the patterning slit sheet into a plurality of sub-deposition spaces. The patterning slit sheet includes a base sheet, in which a plurality of sub patterning slits are formed in a second direction perpendicular to the first direction; and a plurality of patterning bars disposed between adjacent sub patterning slits to form the plurality of patterning slits. The thin film deposition apparatus and the substrate may be disposed apart from each other, and the thin film deposition apparatus or the substrate may be moved relative to the other.

The plurality of barrier plates may extend in the second direction perpendicular to the first direction.

The barrier plate assembly may include a first barrier plate assembly including a plurality of first barrier plates; and a second barrier plate assembly including a plurality of second barrier plates.

The plurality of first barrier plates and the plurality of second barrier plates may extend in the second direction perpendicular to the first direction.

The plurality of first barrier plates and the plurality of second barrier plates may be arranged to correspond to one another.

The deposition source and the barrier plate assembly may be disposed apart from each other.

The barrier plate assembly and the patterning slit sheet may be disposed apart from each other.

The base sheet may be formed of glass.

The plurality of patterning slits may be opening regions between adjacent patterning bars.

A width of each of the plurality of patterning slits may be less than a width of each of the plurality of sub patterning slits.

DETAILED DESCRIPTION

Hereinafter, embodiments will be described in greater detail with reference to the accompanying drawings so that those of ordinary skill in the art may easily accomplish them.

Figure 1:
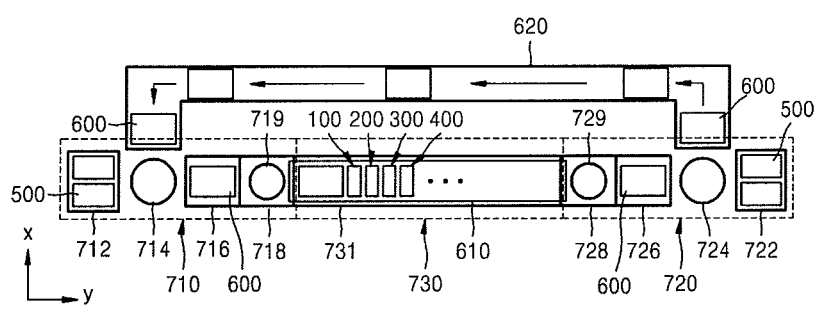
FIG. 1 illustrates a thin film deposition system that includes a thin film deposition apparatus according to an embodiment.
Figure 2:
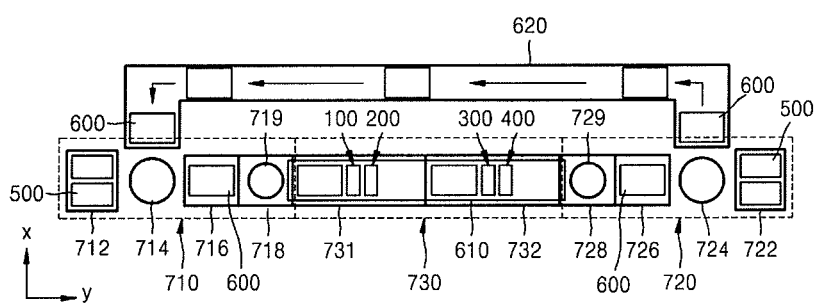
FIG. 2 illustrates a modified example of the thin film deposition system of FIG. 1.
Figure 3:
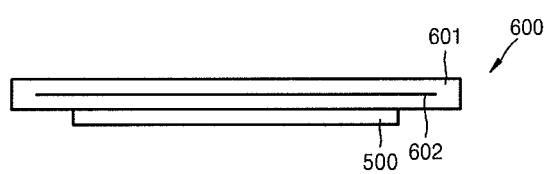
FIG. 3 is a schematic view of an electrostatic chuck according to an embodiment.

FIG. 1 illustrates a thin film deposition system that includes a thin film deposition apparatus according to an embodiment. FIG. 2 illustrates a modified example of the thin film deposition system of FIG. 1. FIG. 3 is a schematic view of an electrostatic chuck 600 according to an embodiment.

Referring to FIG. 1, the thin film deposition apparatus includes a loading unit 710, an unloading unit 720, a deposition unit 730, a first conveyer unit 610, and a second conveyer unit 620.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, disposes it on the electrostatic chuck 600 transferred by the second conveyor unit 620, and moves the electrostatic chuck 600 having the substrate 500 thereon into the transport chamber 716.

The first inversion chamber 718 is disposed adjacent to the transport chamber 716. A first inversion robot 719 disposed in the first inversion chamber 718 inverts the electrostatic chuck 600 and then loads it into the first conveyer unit 610 of the deposition unit 730.

Referring to FIG. 3, the electrostatic chuck 600 may include an electrode 602 embedded in a main body 601 formed of, for example, ceramic, wherein the electrode 602 is supplied with power. The substrate 500 is attached to a surface of the main body 601 when high voltage is applied to the electrode 602.

Referring to FIG. 1, the transport robot 714 places one of the substrates 500 on the electrostatic chuck 600, and the electrostatic chuck 600 having the substrate 500 thereon is loaded into the transport chamber 716. The first inversion robot 719 inverts the electrostatic chuck 600 so that the substrate 500 is turned upside down in the deposition unit 730.

In one embodiment, the unloading unit 720 operates in an opposite manner to the loading unit 710 described above. Specifically, a second inversion robot 729 in a second inversion chamber 728 inverts the electrostatic chuck 600 having the substrate 500 thereon, which has passed through the deposition unit 730, and then moves the electrostatic chuck 600 having the substrate 500 thereon into an ejection chamber 726. Then, an ejection robot 724 removes the electrostatic chuck 600 having the substrate 500 thereon from the ejection chamber 726, separates the substrate 500 from the electrostatic chuck 600, and then loads the substrate 500 onto a second rack 722. The electrostatic chuck 600 separated from the substrate 500 is returned back into the loading unit 710 via the second conveyer unit 620.

However, the above embodiment is not considered limiting. For example, when the substrate 500 is initially disposed on the electrostatic chuck 600, the substrate 500 may be fixed onto a bottom surface of the electrostatic chuck 600 and may then be moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. Referring to FIG. 1, the deposition unit 730 may include a first chamber 731, in which first to four thin film deposition apparatuses 100, 200, 300, and 400 are disposed. Although FIG. 1 illustrates that a total of four thin film deposition apparatuses, i.e., the first to fourth thin film deposition apparatuses 100 to 400, are installed in the first chamber 731, the total number of thin film deposition apparatuses that are to be installed in the first chamber 731 may vary according to a deposition material and deposition conditions. The first chamber 731 may be maintained in a substantially vacuum state during a deposition process.

Referring to FIG. 2, the deposition unit 730 may include the first chamber 731 and a second chamber 732 that are connected to each other. The first and second thin film deposition apparatuses 100 and 200 may be disposed in the first chamber 731, and the third and fourth thin film deposition apparatuses 300 and 400 may be disposed in the second chamber 732. In this regard, more than two chambers may be used.

In the FIG. 1 embodiment, the electrostatic chuck 600 having the substrate 500 thereon may be moved at least to the deposition unit 730 or may be moved sequentially to the loading unit 710, the deposition unit 730, and the unloading unit 720 by the first conveyer unit 610. If the substrate 500 is separated from the electrostatic chuck 600 by the unloading unit 720, then the electrostatic chuck 600 is moved back to the loading unit 710 by the second conveyer unit 620.

Figure 4:
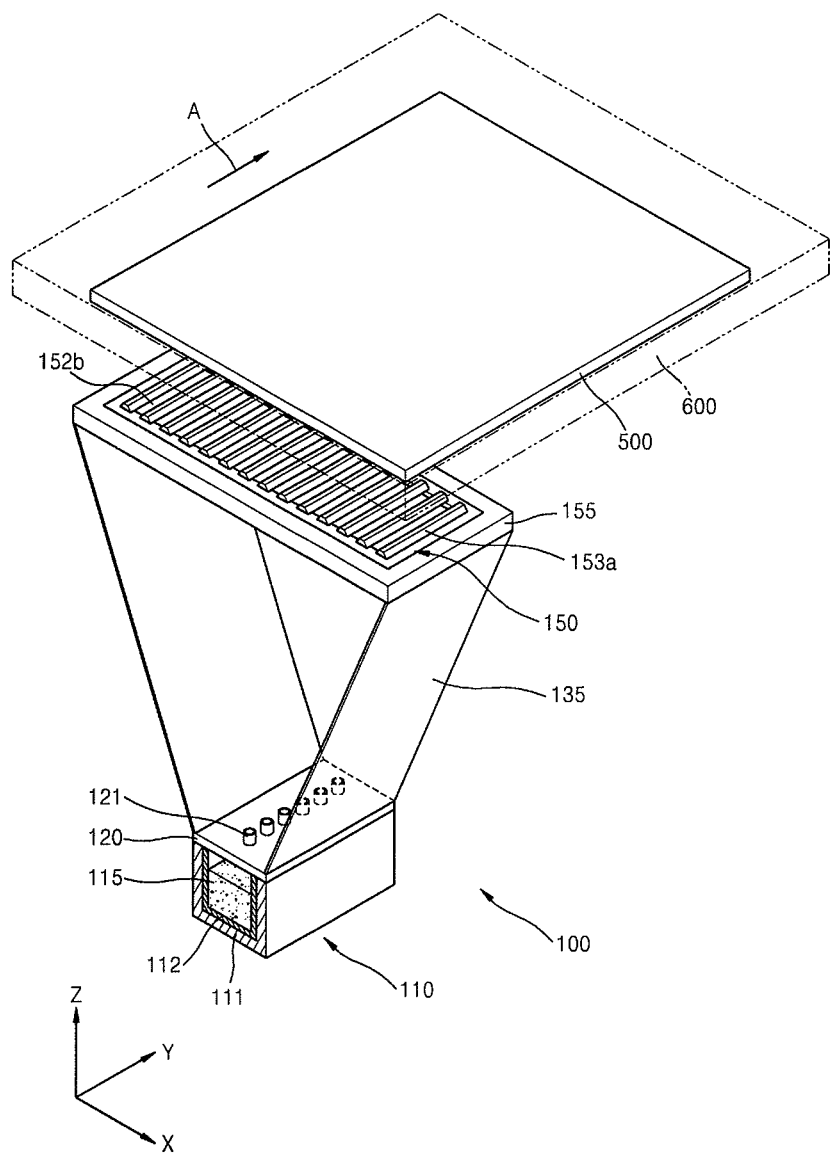
FIG. 4 is a schematic perspective view of a thin film deposition apparatus according to an embodiment.
Figure 5:
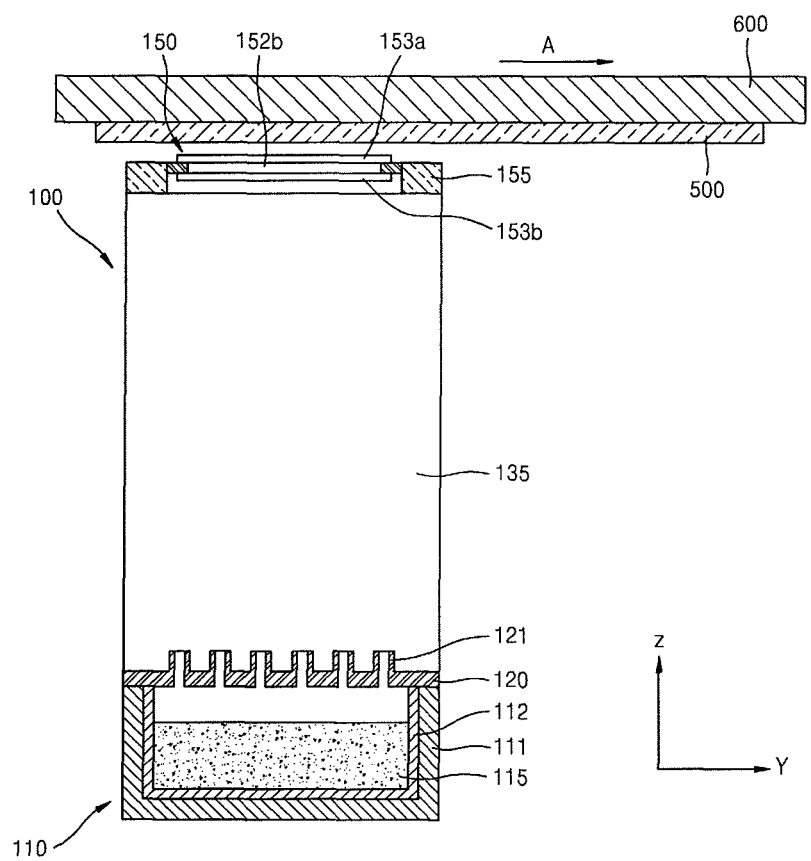
FIG. 5 is a schematic side sectional view of the thin film deposition apparatus of FIG. 4.
Figure 6:
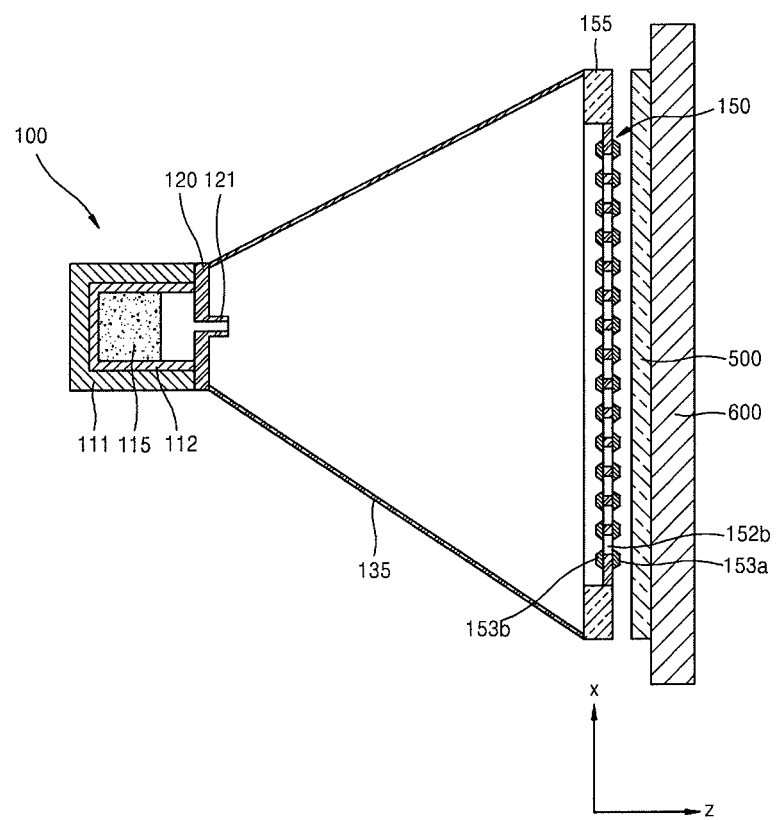
FIG. 6 is a schematic sectional plan view of the thin film deposition apparatus of FIG. 4.

FIG. 4 is a schematic perspective view of a thin film deposition apparatus 100 according to an embodiment. FIG. 5 is a schematic side sectional view of the thin film deposition apparatus 100 of FIG. 4. FIG. 6 is a schematic plan sectional view of the thin film deposition apparatus 100 of FIG. 4.

Referring to FIGS. 4 to 6, the thin film deposition apparatus 100 includes a deposition source 110, a deposition source nozzle unit 120, and a patterning slit sheet 150.

In one embodiment, the first chamber 731 of FIG. 1 is maintained in a substantially high-vacuum state as in a deposition method using a fine metal mask (FMM) so that a deposition material 115 emitted from the deposition source 110 and discharged through the deposition source nozzle unit 120 and the patterning slit sheet 150 may be deposited onto a substrate 500 in a desired pattern. In this embodiment, the temperature of the patterning slit sheet 150 is sufficiently lower than the temperature of the deposition source 110. For example, the temperature of the patterning slit sheet 150 may be about 100° C. or less. The temperature of the patterning slit sheet 150 may be sufficiently low so as to reduce thermal expansion of the patterning slit sheet 150.

The substrate 500 that is a deposition target substrate is disposed in the first chamber 731. The substrate 500 may be a substrate for flat panel displays. A large substrate, such as a mother glass, for manufacturing a plurality of flat panel displays, may be used as the substrate 500. Other substrates may also be employed.

In the current embodiment, deposition is performed while the substrate 500 is moved relative to the thin film deposition apparatus 100.

In a typical deposition method using an FMM, the size of the FMM has to be equal to the size of a substrate. Thus, since the size of the FMM has to be increased as the substrate becomes larger, it is neither straightforward to manufacture a large FMM nor to extend an FMM to be accurately aligned with a pattern.

In one embodiment, deposition may be performed while the thin film deposition apparatus 100 or the substrate 500 is moved relative to the other. In other words, deposition may be substantially continuously performed while the substrate 500, which is disposed so as to face the thin film deposition apparatus 100, is moved in a Y-axis direction. That is, deposition may be performed in a scanning manner while the substrate 500 is moved in a direction (first direction) indicated by an arrow A in FIG. 6.

The patterning slit sheet 150 may be significantly smaller than a FMM used in the typical deposition method. For example, deposition is substantially continuously performed, i.e., in a scanning manner, while the substrate 500 is moved in the Y-axis direction. Thus, the lengths of the patterning slit sheet 150 in the X-axis and Y-axis directions may be significantly less than the lengths of the substrate 500 in the X-axis and Y-axis directions. As described above, since the patterning slit sheet 150 may be formed to be significantly smaller than the FMM used in the typical deposition method, it is relatively easy to manufacture the patterning slit sheet 150. In other words, using the patterning slit sheet 150, which is smaller than the typical FMM, is more convenient in all processes, including etching and other subsequent processes, such as precise extension, welding, moving, and cleaning processes. This is more advantageous for a relatively large display device.

The deposition source 110 that contains and heats the deposition material 115 is disposed in an opposite side of the first chamber 731 to a side in which the substrate 500 is disposed. While being vaporized in the deposition source 110, the deposition material 115 is deposited on the substrate 500.

Specifically, the deposition source 110 includes a crucible 112 filled with the deposition material 115, and a cooling block 111 that heats the crucible 112 to vaporize the deposition material 115 in the crucible 112 towards a side of the crucible 112, and in particular, towards the deposition source nozzle unit 120. The cooling block 111 prevents radiation of heat from the crucible 112 outside, i.e., into the chamber. The cooling block 111 may include a heater (not shown) that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 that may be arranged at substantially equal intervals in the Y-axis direction, i.e., a scanning direction of the substrate 500. The deposition material 115 that is vaporized in the deposition source 110, passes through the deposition source nozzle unit 120 towards the substrate 500. As described above, when the deposition source nozzle unit 120 includes the deposition source nozzles 121 arranged in the Y-axis direction, that is, the scanning direction of the substrate 500, the size of a pattern formed of the deposition material 115 discharged through each of a plurality of patterning slits 152b of the patterning slit sheet 150 is affected by the size of each one of the deposition source nozzles 121 (since there is only one line of the deposition source nozzles 121 in the X-axis direction). Thus, no shadow zone may be formed on the substrate 500. In addition, since the deposition source nozzles 121 are arranged in the scanning direction of the substrate 500, even if there is a difference in flux between the deposition source nozzles 121, the difference may be compensated for and deposition uniformity may be maintained substantially constant.

The patterning slit sheet 150 and a frame 155 are disposed between the deposition source 110 and the substrate 500. A shape of the frame 155 is substantially similar to a window frame. The patterning slit sheet 150 is bound inside the frame 155. The patterning slit sheet 150 includes the patterning slits 152b arranged in the X-axis direction. The deposition material 115 that is vaporized in the deposition source 110, passes through the deposition source nozzle unit 120 and the patterning slit sheet 150 towards the substrate 500.

Figure 7:
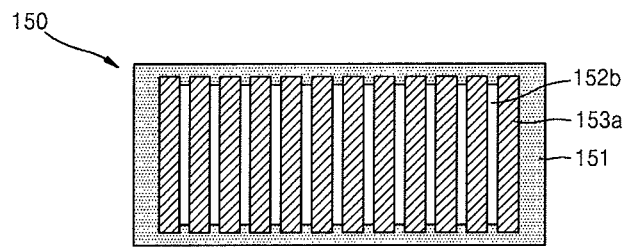
FIG. 7 is a plan view schematically illustrating a patterning slit sheet illustrated in FIG. 4.

The patterning slit sheet 150 may include a base sheet 151 illustrated in FIG. 7 and a plurality of patterning bars 153a. This will be described later.

In addition, the deposition source 110 and the deposition source nozzle unit 120 coupled to the deposition source 110 may be disposed apart from the patterning slit sheet 150 by a predetermined distance. The deposition source 110 and the deposition source nozzle unit 120 coupled to the deposition source 110 may be connected to the patterning slit sheet 150 by first connection members 135. That is, the deposition source 110, the deposition source nozzle unit 120, and the patterning slit sheet 150 may be formed as one body by being connected to each other via the first connection members 135. The first connection members 135 may guide the deposition material 115 discharged through the deposition source nozzles 121 to move straight and not to flow in the X-axis direction. Referring to FIG. 4, the first connection members 135 are formed on left and right sides of the deposition source 110, the deposition source nozzle unit 120, and the patterning slit sheet 150 to guide the deposition material 115 to not flow in the X-axis direction; however, the above structure is not considered limiting. For example, the first connection members 135 may be formed in the form of a sealed box so as to guide the deposition material 115 to not flow in both the X-axis and Y-axis directions.

As described above, the thin film deposition apparatus 100 performs deposition while being moved relative to the substrate 500. In order to move the thin film deposition apparatus 100 relative to the substrate 500, the patterning slit sheet 150 is disposed apart from the substrate 500 by a predetermined distance.

In particular, in the typical deposition method using a FMM, deposition is performed with the FMM in close contact with a substrate in order to prevent formation of a shadow zone on the substrate. However, when the FMM is used in close contact with the substrate, the contact may cause defects to occur. In addition, the size of the mask has to be the same as the size of the substrate since the mask cannot be moved relative to the substrate. Thus, the size of the mask has to be increased as display devices become larger. However, it is not easy to manufacture such a large mask.

In one embodiment, the patterning slit sheet 150 is disposed apart from the substrate 500 by a predetermined distance.

As described above, according to an embodiment, a mask is formed to be smaller than a substrate, and deposition is performed while the mask is moved relative to the substrate. Thus, the mask can be easily manufactured. In addition, defects caused due to the contact between a substrate and a FMM, which may occur in the conventional deposition method, may be prevented. Furthermore, since it is unnecessary to dispose the FMM in close contact with the substrate during a deposition process, the manufacturing time may be reduced.

Figure 8:
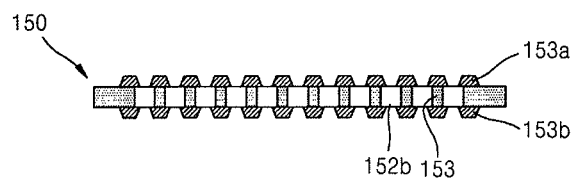
FIG. 8 is a plan view schematically illustrating the patterning slit sheet of FIG. 4.
Figure 9:
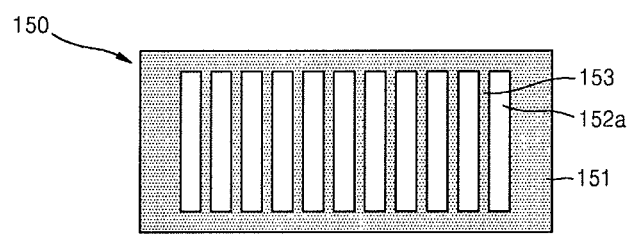
FIG. 9 is a plan view schematically illustrating a base sheet according to an embodiment.
Figure 10:
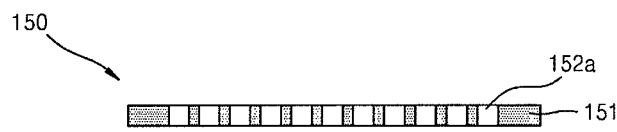
FIG. 10 is a cross-sectional view schematically illustrating the base sheet of FIG. 9.

FIG. 7 is a plan view schematically illustrating the patterning slit sheet 150 illustrated in FIG. 4. FIG. 8 is a plan view schematically illustrating the patterning slit sheet 150 of FIG. 4. FIG. 9 is a plan view schematically illustrating a base sheet 151 according to an embodiment. FIG. 10 is a cross-sectional view schematically illustrating the base sheet 151 of FIG. 9.

Referring to FIGS. 7 and 8, the patterning slit sheet 150 may include the base sheet 151 and a plurality of patterning bars 153a.

Referring to FIGS. 9 and 10, the base sheet 151 may include a plurality of sub-patterning slits 152a and a plurality of patterning ribs 153. The sub-patterning slits 152a are opening regions formed to completely pass through the base sheet 151. The patterning ribs 153 are blocking regions formed between adjacent patterning slits 152b. The sub-patterning slits 152a and the patterning ribs 153 are formed to be long in a first direction (the Y-axis direction of FIG. 4), and are alternately arranged in a second direction substantially perpendicular to the first direction (the X-axis direction of FIG. 4).

In one embodiment, the base sheet 151 is formed of glass. The sub-patterning slits 152a may be formed by etching a glass substrate, processing the glass substrate by using the micro electro mechanical systems (MEMS) technology, or processing the glass substrate by laser.

The patterning slits 152b may be formed by forming the patterning bars 153a between adjacent sub-patterning slits 152a. More specifically, each of the patterning bars 153a may be disposed on one of the patterning ribs 153 located between adjacent sub-patterning slits 152a. Each of the patterning bars 153a may partially block or overlap the sub-patterning slits 152a or the adjacent sub-patterning slits 152a. The patterning slits 152b may be spaces between adjacent patterning bars 153a. The deposition material 115 emitted from the deposition source 110 may pass through the patterning slits 152b and may then be deposited on the substrate 500. Thus, the width of a thin film that is to be deposited on the substrate 500 may be determined by the width of each of the patterning slits 152b. The total number of the patterning slits 152b may be greater than that of the deposition source nozzles 121.

The patterning bars 153a may be disposed on both upper and lower surfaces of the base sheet 151 as illustrated in FIG. 8. Alternatively, the patterning bars 153a may be disposed only on the upper or lower surface of the base sheet 151.

The widths of the sub-patterning slits 152a may be wider than those of the patterning slits 152b. The sub-patterning slits 152a are partially covered by the patterning bars 153a, and the patterning slits 152b are formed between adjacent patterning bars 153a.

A width-wise cross-section of each of the patterning bars 153a may have a trapezoidal shape as illustrated in FIG. 8. However, the width-wise cross-section of each of the patterning bars 153a is not limited to the trapezoidal shape, and may have one of various shapes, for example, a reversed trapezoidal shape, a rectangular shape, or a round shape.

Since the base sheet 151 of the patterning slit sheet 150 is formed of glass as described above, an extension process is not required to be performed unlike in a typical deposition method using a FMM. Also, the patterning slit sheet 150 does not sag toward the deposition source 110 since the base sheet 151 is formed of glass, unlike the FMM. Thus, it is possible to prevent pattern shifting from occurring or a shadow zone from being formed, caused when the patterning slit sheet 150 sags.

In one embodiment, when the substrate 500 is a glass substrate, the substrate 500 and the base sheet 151 have substantially the same thermal expansion since the base sheet 151 is also formed of glass. Thus, even if a thin film deposition process is performed for a long time, it is possible to minimize a defect in a thin film pattern, caused by the difference between the thermal expansions of the substrate 500 and the base sheet 151.

Also, the patterning slits 152b of the patterning slit sheet 150 may be formed by forming the sub-patterning slits 152a in the base sheet 151 and then forming the patterning bars 153a on the resultant structure, thereby obtaining a high-definition pattern.

Figure 11:
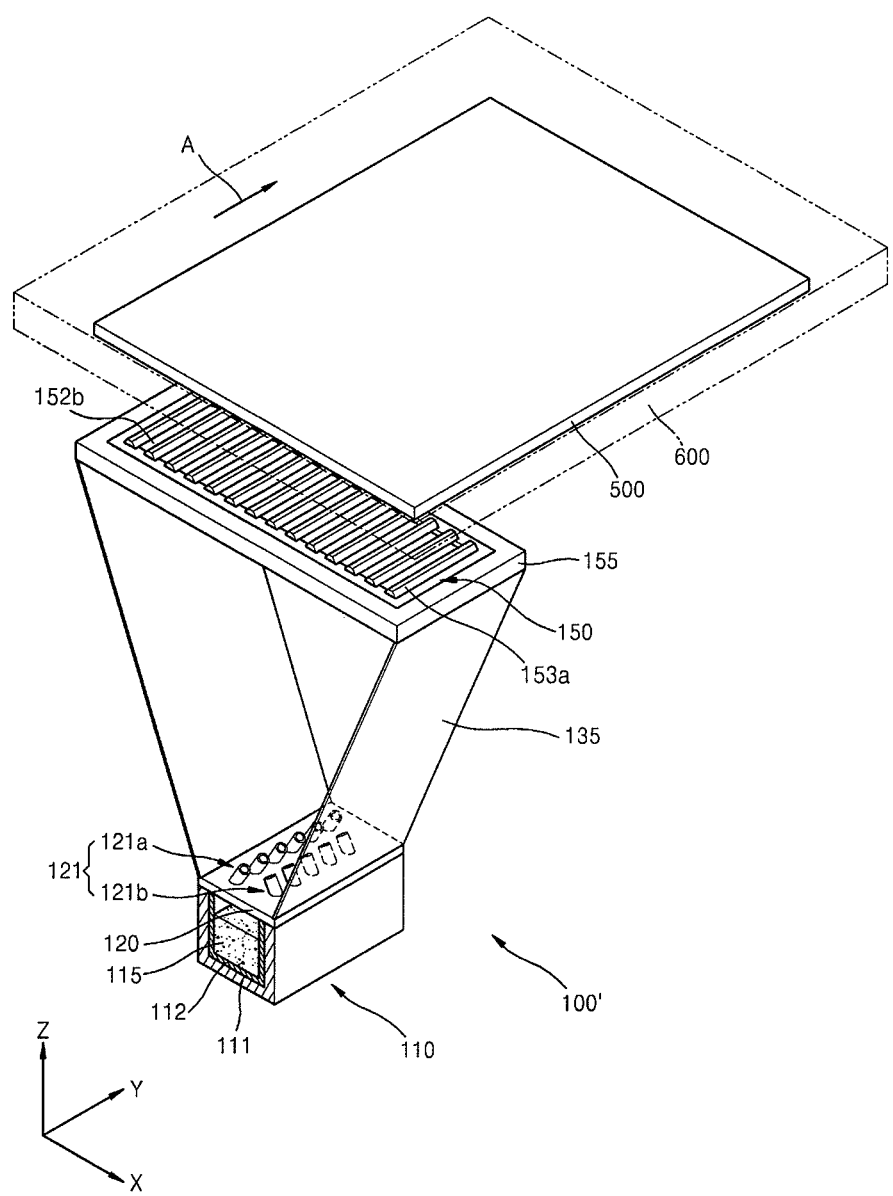
FIG. 11 is a schematic perspective view of a thin film deposition apparatus according to another embodiment.

FIG. 11 is a schematic perspective view of a thin film deposition apparatus 100' according to another embodiment. Referring to FIG. 11, the thin film deposition apparatus 100' includes a deposition source 110, a deposition source nozzle unit 120, and a patterning slit sheet 150. The deposition source 110 includes a crucible 112 filled with a deposition material 115, and a cooling block 111 that heats the crucible 112 to vaporize the deposition material 115 in the crucible 112 toward the deposition source nozzle unit 120. The deposition source nozzle unit 120, which has a planar shape, is disposed at a side of the deposition source 110. The deposition source nozzle unit 120 includes a plurality of deposition source nozzles 121 arranged in the Y-axis direction. The patterning slit sheet 150 and a frame 155 are disposed between the deposition source 110 and a substrate 500. The patterning slit sheet 150 includes a plurality of patterning slits 152b arranged in the X-axis direction. The deposition source 110 and the deposition source nozzle unit 120 may be connected to the patterning slit sheet 150 by second connection members 133.

In one embodiment, the deposition source nozzles 121 formed on the deposition source nozzle unit 120 are tilted at a predetermined angle, unlike the thin file deposition apparatus 100 of FIG. 4. For example, the deposition source nozzles 121 may include deposition source nozzles 121a and 121b arranged in two rows.

The deposition source nozzles 121a and 121b may be arranged in two rows to alternate in a zigzag pattern. The deposition source nozzles 121a and 121b may be tilted by a predetermined angle with respect to an XZ plane.

In one embodiment, the deposition source nozzles 121a and 121b are arranged to tilt at a predetermined angle. The deposition source nozzles 121a in a first row and the deposition source nozzles 121b in a second row may tilt to face each other. That is, the deposition source nozzles 121a of the first row in a left part of the deposition source nozzle unit 120 may tilt to face a right side portion of the patterning slit sheet 150, and the deposition source nozzles 121b of the second row in a right part of the deposition source nozzle unit 120 may tilt to face a left side portion of the patterning slit sheet 150.

Accordingly, a deposition rate of the deposition material 115 may be adjusted to lessen the difference between thicknesses of thin films formed on center and end portions of the substrate 500, thereby improving thickness uniformity. Moreover, utilization efficiency of the deposition material 115 may also be improved.

Figure 12:
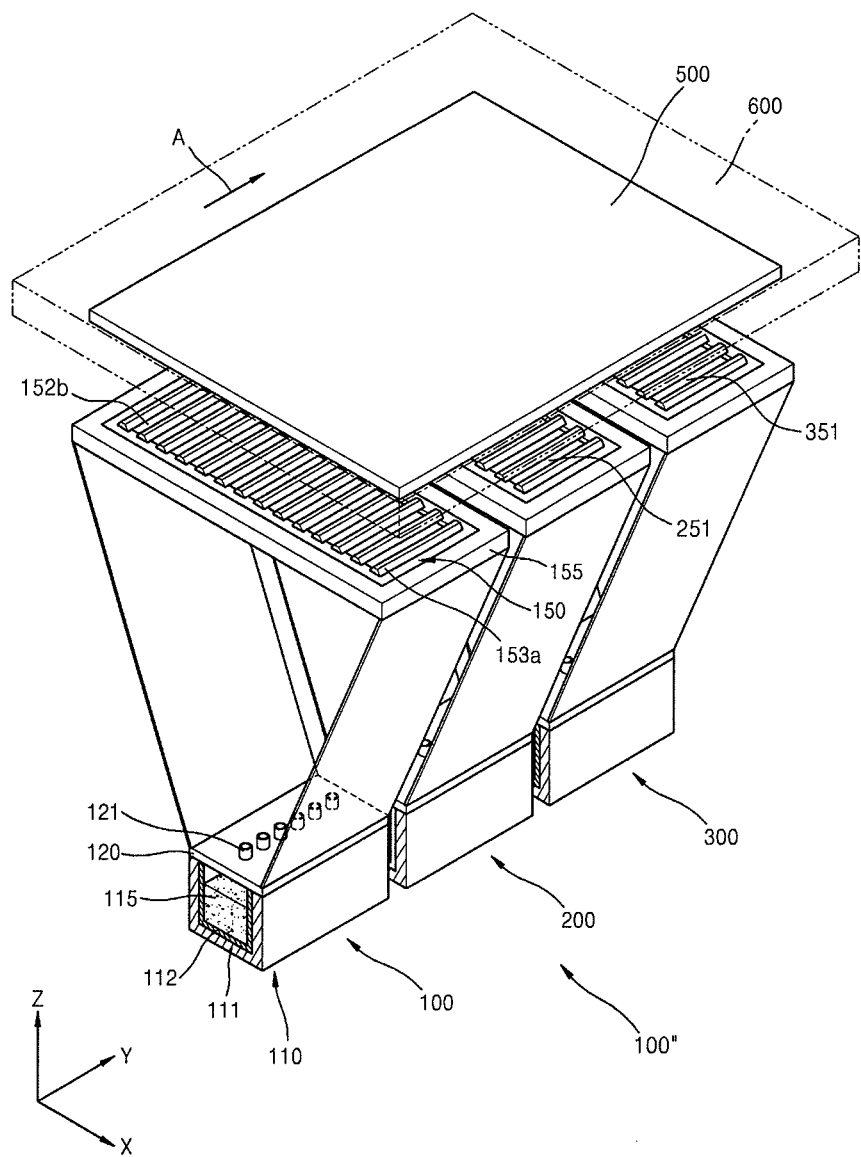
FIG. 12 is a schematic perspective view of a thin film deposition apparatus according to another embodiment.

FIG. 12 is a schematic perspective view of a thin film deposition apparatus 100" according to another embodiment. Referring to FIG. 12, the thin film deposition apparatus 100" may include a plurality of thin film deposition apparatuses, each of which has the structure of the thin film deposition apparatus 100 illustrated in FIGS. 4 to 6. In other words, the thin film deposition apparatus 100" may include a multi-deposition source that substantially simultaneously discharges deposition materials for forming a red (R) emission layer, a green (G) emission layer, and a blue (B) emission layer.

In one embodiment, the thin film deposition apparatus 100" includes a first thin film deposition apparatus 100, a second thin film deposition apparatus 200, and a third thin film deposition apparatus 300. Each of the first to third thin film deposition apparatuses 100-300 has the same structure as the thin film deposition apparatus 100 described above with reference to FIGS. 4 through 6, and a detailed description thereof will thus not be provided here.

The deposition sources 110 of the first thin film deposition apparatus 100, the second thin film deposition apparatus 200 and the third thin film deposition apparatus 300 may contain different deposition materials, respectively. For example, the first thin film deposition apparatus 100 may contain a deposition material for forming an R emission layer, the second thin film deposition apparatus 200 may contain a deposition material for forming a G emission layer, and the third thin film deposition apparatus 300 may contain a deposition material for forming a B emission layer.

In a typical method of manufacturing an organic light-emitting display device, a separate chamber and mask are generally used to form each color emission layer. However, when the thin film deposition apparatus 100" according to one embodiment is used, the R emission layer, the G emission layer, and the B emission layer may be formed at the same time with a single multi-deposition source. Thus, a time needed to manufacture an organic light-emitting display is sharply reduced. In addition, the organic light-emitting display may be manufactured with a reduced number of chambers, so that equipment costs are also markedly reduced.

Although not illustrated, patterning slit sheets 150 of the first to third thin film deposition apparatus 100 to 300 may be arranged to be offset by a constant distance with respect to each other, thereby preventing deposition regions corresponding to the patterning slit sheets 150 from overlapping with one another on a substrate 500. In other words, if the first to third thin film deposition apparatuses 100-300 are used to deposit the R emission layer, the G emission layer, and the B emission layer, respectively, then patterning slits 152b, 251 and 351 of the first to third thin film deposition apparatuses 100-300 are arranged not to be aligned with respect to each other, thereby forming the R, G and B emission layers in different regions of the substrate 500, respectively.

The deposition materials for forming the R emission layer, the G emission layer, and the B emission layer may be vaporized at different temperatures, respectively. Therefore, the temperatures of deposition sources 110 of the respective first to third thin film deposition apparatuses 100 to 300 may be set to be different.

Although FIG. 12 illustrates that the thin film deposition apparatus 100" includes the three thin film deposition apparatuses 100 to 300, this is not considered limiting. For example, one embodiment may include more than three thin film deposition apparatuses, each of which contains a different deposition material. Further, one embodiment may include five thin film deposition apparatuses respectively containing materials for an R emission layer, a G emission layer, a B emission layer, an auxiliary R' layer of the R emission layer, and an auxiliary G' layer of the G emission layer.

As described above, a plurality of thin films may be formed at the same time with a plurality of thin film deposition apparatuses, and thus manufacturing yield and deposition efficiency are improved. In addition, the overall manufacturing process is simplified, and the manufacturing costs are reduced.

Figure 13:
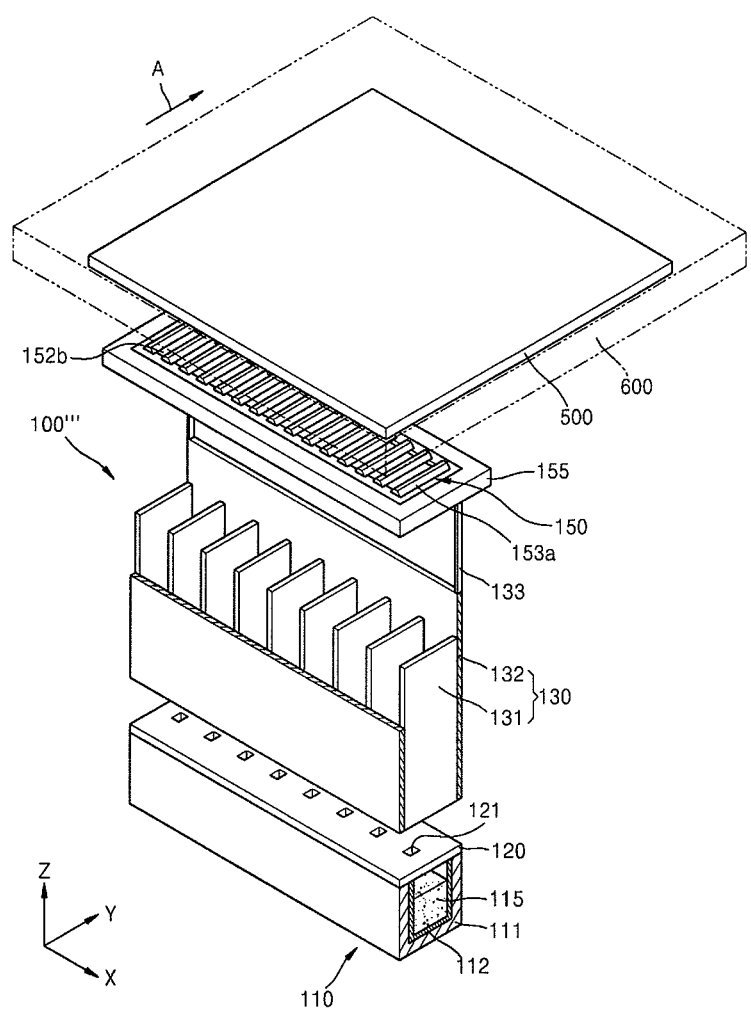
FIG. 13 is a schematic perspective view of a thin film deposition apparatus according to another embodiment.
Figure 14:
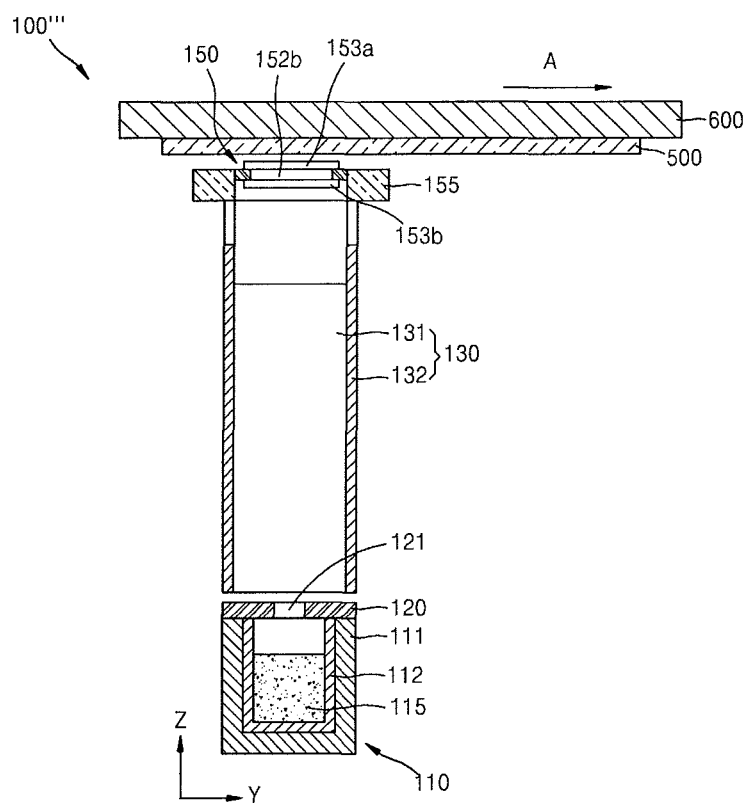
FIG. 14 is a schematic side sectional view of the thin film deposition apparatus of FIG. 13.
Figure 15:
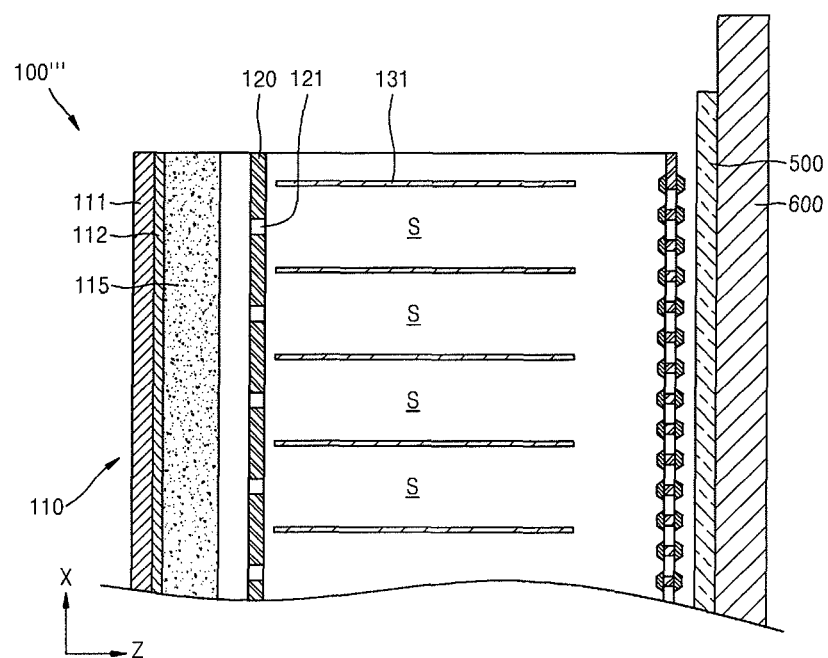
FIG. 15 is a schematic sectional plan view of the thin film deposition apparatus of FIG. 13.

FIG. 13 is a schematic perspective view of a thin film deposition apparatus 100''' according to another embodiment. FIG. 14 is a schematic side sectional view of the thin film deposition apparatus 100" of FIG. 13. FIG. 15 is a schematic plan sectional view of the thin film deposition apparatus 100''' of FIG. 13.

Referring to FIGS. 13 through 15, the thin film deposition apparatus 100''' includes a deposition source 110, a deposition source nozzle unit 120, a barrier plate assembly 130, and a plurality of patterning slits 152b.

Although a chamber is not illustrated in FIGS. 13 through 15 for convenience of explanation, all the components of the thin film deposition apparatus 100''' may be disposed within a chamber that is maintained at an appropriate degree of vacuum. The chamber is maintained at an appropriate degree of vacuum in order to allow a deposition material 115 to move in a substantially straight line through the thin film deposition apparatus 100'''.

In the chamber, a substrate 500 that is a deposition target substrate is transferred by an electrostatic chuck 600. The substrate 500 may be a substrate for flat panel displays. A large substrate, such as a mother glass, for manufacturing a plurality of flat panel displays, may be used as the substrate 500. Other substrates may also be employed.

The substrate 500 may be moved relative to the thin film deposition apparatus 100'''. For example, the substrate 500 may be moved in a direction of an arrow A, relative to the thin film deposition apparatus 100".

A patterning slit sheet 150 included in the thin film deposition apparatus 100''' may be significantly smaller than a FMM used in a typical deposition method. That is, in the thin film deposition apparatus 100''', deposition is continuously performed, i.e., in a scanning manner, while the substrate 500 is moved in the Y-axis direction. Thus, a length of the patterning slit sheet 150 in the Y-axis direction may be significantly less than a length of the substrate 500 provided a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in the scanning manner while the substrate 500 or the thin film deposition apparatus 100''' is moved relative to the other.

As in the previous embodiments, the patterning slit sheet 150 is more convenient in all processes, including etching and other subsequent processes, such as precise extension, welding, moving, and cleaning processes, compared to the typical deposition method using the larger FMM. This is more advantageous for a relatively large display device.

The deposition source 110 that contains and heats the deposition material 115 is disposed in an opposite side of the chamber to a side in which the substrate 500 is disposed.

The deposition source 110 includes a crucible 112 that is filled with the deposition material 115, and a cooling block 111 surrounding the crucible 112. The cooling block 111 prevents radiation of heat from the crucible 112 outside, i.e., into the chamber. The cooling block 111 may include a heater (not shown) that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 that may be arranged at substantially equal intervals in the X-axis direction. The deposition material 115 that is vaporized in the deposition source 110 passes through the deposition source nozzles 121 of the deposition source nozzle unit 120 towards the substrate 500 that is a deposition target substrate.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged substantially parallel to each other at equal intervals in the X-axis direction. Each of the barrier plates 131 may be arranged parallel to an YZ plane in FIG. 13, and may have a rectangular shape. The barrier plates 131 arranged as described above partition a deposition space between the deposition source nozzle unit 120 and the patterning slit sheet 150 into a plurality of sub-deposition spaces S. In the thin film deposition apparatus 100''', as illustrated in FIG. 14, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, the above arrangement is not considered limiting. For example, a plurality of deposition source nozzles 121 may be disposed between two adjacent barrier plates 131. In this case, the deposition source nozzles 121 may be also respectively located at the midpoint between two adjacent barrier plates 131.

Since the barrier plates 131 partition the space between the deposition source nozzle unit 120 and the patterning slit sheet 150 into the sub-deposition spaces S as described above, the deposition material 115 discharged through each of the deposition source nozzles 121 is not mixed with the deposition material 115 discharged through the other deposition source nozzles slits 121, and passes through the patterning slits 152b so as to be deposited on the substrate 500. In other words, the barrier plates 131 guide the deposition material 115, which is discharged through the deposition source nozzles slits 121, to move straight, i.e., to flow in the Z-axis direction.

As described above, the deposition material 115 is forced to move straight by installing the barrier plates 131, so that a smaller shadow zone may be formed on the substrate 500 compared to a case where no barrier plates are installed. Thus, the thin film deposition apparatus 100''' and the substrate 500 can be disposed apart from each other by a predetermined distance. This will be described later in detail.

The barrier plate frame 132, which covers the sides of the barrier plates 131, maintains the positions of the barrier plates 131, and guides the deposition material 115, which is discharged through the deposition source nozzles 121, not to flow in the Y-axis direction.

The deposition source nozzle unit 120 and the barrier plate assembly 130 may be disposed apart from each other by a predetermined distance. This may prevent heat radiated from the deposition source unit 110 from being conducted to the barrier plate assembly 130. However, the above embodiment is not considered limiting. For example, when an appropriate heat insulator (not shown) is disposed between the deposition source nozzle unit 120 and the barrier plate assembly 130, the deposition source nozzle unit 120 and the barrier plate assembly 130 may be bound together with the heat insulator therebetween.

In addition, the barrier plate assembly 130 may be constructed to be detachable from the thin film deposition apparatus 100'''. In one embodiment, the deposition space is enclosed by using the barrier plate assembly 130, so that the deposition material 115 that remains undeposited is mostly deposited within the barrier plate assembly 130. Thus, since the barrier plate assembly 130 is constructed to be detachable from the thin film deposition apparatus 100''', when a large amount of the deposition material 115 lies in the barrier plate assembly 130 after a long deposition process, the barrier plate assembly 130 may be detached from the thin film deposition apparatus 100''' and then placed in a separate deposition material recycling apparatus in order to recover the deposition material 115. Accordingly, a reuse rate of the deposition material 115 is increased, so that the deposition efficiency is improved, and thus the manufacturing costs are reduced.

The patterning slit sheet 150 and a frame 155 are disposed between the deposition source 110 and the substrate 500. The shape of the frame 155 may be substantially similar to a window frame. The patterning slit sheet 150 is bound inside the frame 155. The patterning slit sheet 150 includes the plurality of patterning slits 152b arranged in the X-axis direction. The patterning slits 152b extend in the Y-axis direction. The deposition material 115 that has been vaporized in the deposition source 110 and passed through the deposition source nozzles 121, passes through the patterning slits 152b towards the substrate 500.

The patterning slit sheet 150 may be formed of a metal thin film, and is fixed onto the frame 150 such that a tensile force is exerted thereon. The patterning slits 152b may be formed by etching the patterning slit sheet 150 according to a stripe pattern.

In the thin film deposition apparatus 100''', the total number of the patterning slits 152b may be greater than the total number of the deposition source nozzles 121. In addition, the total number of the patterning slits 152b is greater than the total number of deposition source nozzles 121 disposed between two adjacent barrier plates 131. The number of patterning slits 152b may be equal to the number of deposition patterns to be formed on the substrate 500.

The barrier plate assembly 130 and the patterning slit sheet 150 may be disposed apart from each other by a predetermined distance. The barrier plate assembly 130 and the patterning slit sheet 150 may be connected by second connection members 133. The temperature of the barrier plate assembly 130 may increase to about 100° C. or higher due to the deposition source 110 whose temperature is high. Thus, the barrier plate assembly 130 and the patterning slit sheet 150 are disposed apart from each other by the predetermined distance in order to prevent heat from the barrier plate assembly 130 from being conducted to the patterning slit sheet 150.

As described above, the thin film deposition apparatus 100 according to the current embodiment performs deposition while being moved relative to the substrate 500. In order to move the thin film deposition apparatus 100 relative to the substrate 500, the patterning slit sheet 150 is disposed apart from the substrate 500 by a predetermined distance. In addition, in order to prevent formation of a relatively large shadow zone on the substrate 500 when the patterning slit sheet 150 and the substrate 500 are disposed apart from each other, the barrier plates 131 are arranged between the deposition source nozzle unit 120 and the patterning slit sheet 150 to force the deposition material 115 to move in a straight direction. Thus, the size of the shadow zone that may be formed on the substrate 500 may be sharply reduced.

In one embodiment, the patterning slit sheet 150 is disposed apart from the substrate 500 by a predetermined distance. This may be facilitated by installing the barrier plates 131 to reduce the size of a shadow zone to be formed on the substrate 500.

As described above, when the patterning slit sheet 150 is manufactured to be smaller than the substrate 500, the patterning slit sheet 150 may be moved relative to the substrate 500 during deposition. Thus, it is no longer necessary to manufacture a large FMM as used in the typical deposition method. Since the substrate 500 and the patterning slit sheet 150 are disposed apart from each other, defects caused due to contact therebetween may be prevented. In addition, since it is unnecessary to contact the substrate 500 with the patterning slit sheet 150 during a deposition process, the manufacturing speed may be improved.

Figure 16:
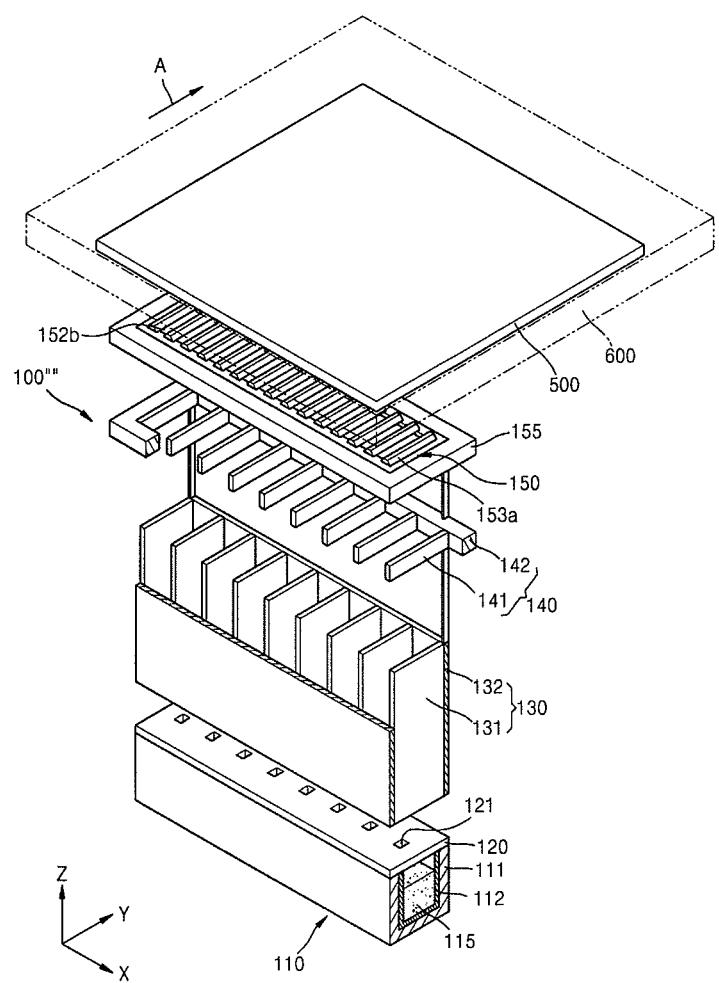
FIG. 16 is a schematic perspective view of a thin film deposition apparatus according to another embodiment.

FIG. 16 is a schematic perspective view of a thin film deposition apparatus 100'''' according to another embodiment. Referring to FIG. 16, the thin film deposition apparatus 100'''' includes a deposition source 110, a deposition source nozzle unit 120, a first barrier plate assembly 130, a second barrier plate assembly 140, and a patterning slit sheet 150.

Although a chamber is not illustrated in FIG. 16 for convenience of explanation, all the components of the thin film deposition apparatus 100'''' may be disposed within a chamber that is maintained at an appropriate degree of vacuum. The chamber is maintained at an appropriate degree of vacuum in order to allow a deposition material 115 to move in a substantially straight line through the thin film deposition apparatus 100''''.

A substrate 500, which is a deposition target substrate, is disposed in the chamber. The deposition source 110 that contains and heats the deposition material 115 is disposed in an opposite side of the chamber to a side in which the substrate 500 is disposed.

The structures of the deposition source 110 and the patterning slit sheet 150 are the same as those in the embodiment described above with reference to FIG. 13, and thus a detailed description thereof will not be provided here. The first barrier plate assembly 130 is also the same as the barrier plate assembly 130 of the embodiment described above with reference to FIG. 13, and thus a detailed description thereof will not be provided here.

In the current embodiment, the second barrier plate assembly 140 is disposed at a side of the first barrier plate assembly 130. The second barrier plate assembly 140 includes a plurality of second barrier plates 141, and a second barrier plate frame 142 that covers sides of the plurality of second barrier plates 141.

The second barrier plates 141 may be arranged parallel to each other at equal intervals in the X-axis direction. In addition, each of the plurality of second barrier plates 141 may be formed to extend in the YZ plane in FIG. 16, i.e., perpendicular to the X-axis direction.

The first barrier plates 131 and the second barrier plates 141 arranged as described above partition a deposition space between the deposition source nozzle unit 120 and the patterning slit sheet 150. The deposition space is divided by the first barrier plates 131 and the second barrier plates 141 into sub-deposition spaces that respectively correspond to the deposition source nozzles 121 through which the deposition material 115 is discharged.

The second barrier plates 141 may be disposed to correspond respectively to the first barrier plates 131. In other words, the second barrier plates 141 may be aligned with respect to the first barrier plates 131, respectively. That is, each pair of the corresponding first and second barrier plates 131 and 141 may be located on the same plane. In one embodiment, the first and second barrier plates 131 and 141 are respectively illustrated as having substantially the same thickness in the X-axis direction. In another embodiment, the second barrier plates 141, which need to be accurately aligned with the patterning slits 152b, may be formed to be relatively thin, whereas the first barrier plates 131, which do not need to be precisely aligned with the patterning slits 152b, may be formed to be relatively thick. This makes it easier to manufacture the thin film deposition apparatus 100''''.

A plurality of the thin film deposition apparatuses 100''' may be successively disposed in the first chamber 731 of FIG. 1, as illustrated in FIG. 1. In this case, the plurality of the thin film deposition apparatuses 100''' may be used to deposit different deposition materials, respectively. For example, the thin film deposition apparatuses 100'''' may have a plurality of patterning slits having different patterns, so that pixels of different colors, for example, red, green and blue, may be simultaneously defined through a film deposition process.

Figure 17:
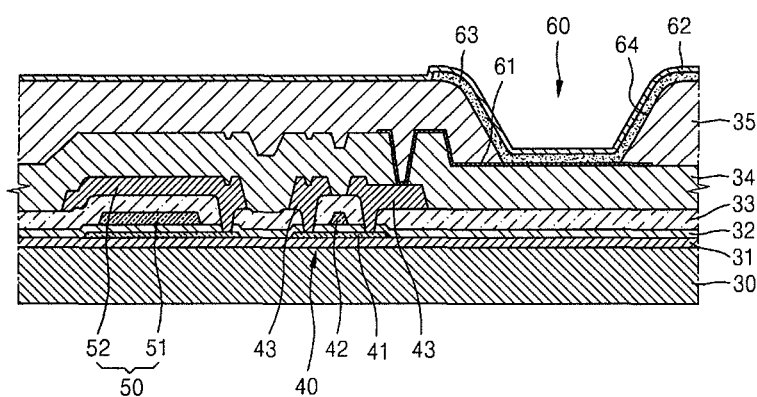
FIG. 17 is a cross-sectional view of an active matrix organic light-emitting display manufactured by using a thin film deposition apparatus, according to an embodiment.

FIG. 17 is a cross-sectional view of an active matrix organic light-emitting display device manufactured by using a thin film deposition apparatus, according to an embodiment. Referring to FIG. 17, the active matrix organic light-emitting display device is formed on a substrate 30. The substrate 30 may be formed of a transparent material, for example, glass, plastic, or metal. An insulating layer 31, such as a buffer layer, is formed on an entire surface of the substrate 30.

Referring to FIG. 17, a thin film transistor (TFT) 40, a capacitor 50, and an organic light-emitting diode (OLED) 60 are disposed on the insulating layer 31.

An active layer 41 is formed in a predetermined pattern on the insulating layer 31. A gate insulating layer 32 is formed to cover the active layer 41. The active layer 41 may include a p-type or n-type semiconductor material.

A gate electrode 42 of the TFT 40 is formed in a region of the gate insulating layer 32 corresponding to the active layer 41. An interlayer insulating layer 33 is formed to cover the gate electrode 42. Then, the gate insulating layer 32 and the interlayer insulating layer 33 are etched by, for example, dry etching, to form a contact hole for exposing parts of the active layer 41.

Then, a source/drain electrode 43 is formed on the interlayer insulating layer 33 to contact the active layer 41 exposed through the contact hole. A passivation layer 34 is formed to cover the source/drain electrode 43, and is etched to expose a part of the drain electrode 43. An additional insulating layer (not shown) may be further formed on the passivation layer 34 so as to planarize the passivation layer 34.

The OLED 60 displays predetermined image information by emitting red, green, or blue light as current flows therethrough. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. If the low-molecular weight organic material is used, then the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. Such a low-molecular weight organic material may be deposited using vacuum deposition by using one of the thin film deposition apparatuses of FIGS. 4 to 16.

After the opening 64 is formed in the pixel defining layer 35, the substrate 30 is transferred to a chamber (not shown), as illustrated in FIG. 1.

After the organic emission layer 63 is formed, the second electrode 62 may be formed by the same deposition method as used to form the organic emission layer 63.

The first electrode 61 may function as an anode and the second electrode 62 may function as a cathode, or vice versa. The first electrode 61 may be patterned to correspond to individual pixel regions, and the second electrode 62 may be formed to cover all the pixels.

The first electrode 61 may be formed as a transparent electrode or a reflective electrode. The transparent electrode may be formed of an indium tin oxide (ITO), an indium zinc oxide (IZO), a zinc oxide (ZnO), or an indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and then forming a transparent electrode layer of an ITO, an IZO, a ZnO, or an $In_2O_3$ on the reflective layer. The first electrode 61 may be formed by forming a layer by, for example, sputtering, and then patterning the layer by for example, photolithography.

The second electrode 62 may also be formed as a transparent electrode or a reflective electrode. When the second electrode 62 is formed as a transparent electrode, the second electrode 62 functions as a cathode. The transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63, and forming an auxiliary electrode layer or a bus electrode line thereon from ITO, IZO, ZnO, $In_2O_3$, or the like. When the second electrode 62 is formed as a reflective electrode, a reflective layer may be formed by depositing Li, Ca, LiF/Ca, LiF/Al, Al, Ag, Mg, or a compound thereof on the organic emission layer 63. The second electrode 62 may be formed by using the same deposition method as used to form the organic emission layer 63 described above.

The thin film deposition apparatuses according to at least one of the above embodiments may be applied to form an organic or inorganic layer of an organic TFT, and to form layers from various materials.

Further, one embodiment may be simply applied to the manufacture of large-sized display devices on a mass scale. In addition, the thin film deposition apparatus and the organic-light-emitting display device may be easily manufactured, may improve manufacturing yield and deposition efficiency, and may allow deposition materials to be reused. Furthermore, a patterning slit sheet included in the thin film deposition apparatus may be prevented from sagging.

While certain embodiments have been particularly shown and described with reference to the accompanying drawings, it will be understood by those of ordinary skill in the art that various changes in form and details may be made therein without departing from the spirit and scope of the following claims.

What is claimed is:

1. A method of manufacturing an organic light-emitting diode (OLED) display, the method comprising:
   providing a substrate;
   discharging a deposition material from a deposition source;
   passing the discharged deposition material through a deposition source nozzle unit, wherein the deposition source nozzle unit comprises a plurality of deposition source nozzles arranged in a first direction; and
   depositing the discharged deposition material, which has passed through the deposition source nozzle unit, onto the substrate through a patterning slit sheet, wherein the patterning slit sheet is closer to the substrate than the deposition source nozzle unit, and wherein the patterning slit sheet comprises i) a base sheet, in which a plurality of sub-patterning slits are arranged in a second direction crossing the first direction, the base sheet having a plurality of patterning ribs between the plurality of sub-patterning slits, and ii) a plurality of patterning bars on the plurality of patterning ribs, each of the plurality of patterning bars partially blocking each of the adjacent sub-patterning slits, all the plurality of patterning bars being substantially parallel to each other,
   wherein the depositing is performed while moving the substrate relative to the patterning slit sheet in the first direction.

2. The method of claim 1, wherein the deposition source, the deposition source nozzle unit, and the patterning slit sheet are formed as one body.

3. The method of claim 1, wherein the deposition source, the deposition source nozzle unit, and the patterning slit sheet are integrally connected as one body by connection members that guide movement of the deposition material.

4. The method of claim 3, wherein the connection members are formed to seal a space between the deposition source, the deposition source nozzle unit, and the patterning slit sheet.

5. The method of claim 1, wherein the deposition source nozzles are tilted at a predetermined angle.

6. The method of claim 5, wherein the deposition source nozzles comprise deposition source nozzles arranged in two rows in the first direction,
and wherein the deposition source nozzles in the two rows are tilted to face each other.

7. The method of claim 5, wherein the deposition source nozzles comprise deposition source nozzles arranged in two rows in the first direction and face the patterning slit sheet.

8. The method of claim 1, wherein the base sheet is formed of glass.

9. The method of claim 1, wherein patterning slits are formed as opening regions between adjacent patterning bars.

10. The method of claim 9, wherein the width of each of the patterning slits is less than the width of each of the sub-patterning slits.

\* \* \* \* \*